US008000408B2

(12) United States Patent
Premanakathan et al.

(10) Patent No.: US 8,000,408 B2
(45) Date of Patent: Aug. 16, 2011

(54) LOOP DELAY AND GAIN CONTROL METHODS IN CLOSED-LOOP TRANSMITTERS AND WIRELESS DEVICES

(75) Inventors: Pravin Premanakathan, Chandler, AZ (US); Bing Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 636 days.

(21) Appl. No.: 12/119,618

(22) Filed: May 13, 2008

(65) Prior Publication Data

US 2009/0285330 A1  Nov. 19, 2009

(51) Int. Cl.
 *H04K 1/02* (2006.01)
(52) U.S. Cl. .................................................. 375/297
(58) Field of Classification Search .............. 375/297; 455/7, 127.2
 See application file for complete search history.

(56) References Cited

U.S. PATENT DOCUMENTS

| 7,215,972 | B2 | 5/2007 | Premakanthan | |
|---|---|---|---|---|
| 2002/0186783 | A1* | 12/2002 | Opas et al. | 375/297 |
| 2006/0223463 | A1* | 10/2006 | Rahman et al. | 455/127.2 |
| 2007/0249283 | A1* | 10/2007 | Braithwaite | 455/7 |

* cited by examiner

*Primary Examiner* — David C. Payne
*Assistant Examiner* — Leon-Viet Nguyen
(74) *Attorney, Agent, or Firm* — Ingrassia Fisher & Lorenz, P.C.

(57) ABSTRACT

Embodiments include transmitters, wireless devices, and methods for performing loop delay and gain control. In a transmitter, a gain application element receives and combines digital input samples and a digital gain signal to generate gain-compensated digital samples. A power amplifier receives and amplifies an analog version of the gain-compensated digital samples to generate an antenna output signal. A feedback path generates an analog feedback signal from the antenna output signal, to produce a sequence of digital feedback samples from the analog feedback signal, and generates the digital gain signal from the sequence of digital feedback samples and a loop gain estimate. A loop delay and gain calculator calculates a loop delay estimate from the gain-compensated digital samples and the sequence of digital feedback samples, and calculates the loop gain estimate using the loop delay estimate, the gain-compensated digital samples, and the sequence of digital feedback samples.

20 Claims, 5 Drawing Sheets

LOOP DELAY AND GAIN CONTROL METHODS IN CLOSED-LOOP TRANSMITTERS AND WIRELESS DEVICES

TECHNICAL FIELD

Embodiments of the inventive subject matter relate to transmit power control systems and methods, and more particularly to adaptive, closed-loop, transmit power control systems and methods that determine and compensate for loop delay and gain.

BACKGROUND

Some conventional wireless communication devices include a closed-loop transmit power control system for amplification and transmission of a wireless signal. Such systems include a power control feed-forward path and a transmit power detector feedback path. A power amplifier or voltage controlled amplifier (VCA) along the power control feed-forward path amplifies the signal to be transmitted. The transmit power detector feedback path detects the power of the amplified signal, and determines and provides control or bias voltages to apply to the system's power amplifier or VCA, thus controlling the transmit power ramp up and ramp down curves.

Because of the closed-loop design, loop delay and gain are inherent in such transmitters. In order to preserve closed-loop stability and to enhance performance, traditional closed-loop transmit power control systems attempt to compensate for loop delay and gain during operation. However, compensation for loop delay and gain is relatively complex, because loop delay and gain may vary significantly as a function of variables such as supply voltage (e.g., battery voltage or $V_{batt}$), temperature, frequency band of operation, manufacturing process variations, and/or characteristics of the slope of the control voltage versus the transmit power output curve, among other things.

Some traditional closed-loop transmit power control systems include factory-programmed loop control parameters (e.g., loop delay and loop gain values). The manufacturing process for each one of such devices includes a time-consuming factory calibration procedure in order to generate the factory-programmed loop delay and gain values for each frequency band of operation, and for different values within a range of anticipated operating power levels, steps of power change, and variations in temperature, battery power, and frequency bands of operation. Although factory calibration may provide adequate system performance, the calibration process is time-intensive, complex, and costly.

Other traditional closed-loop transmit power control systems preserve control loop stability by estimating loop delay and gain. However, these systems utilize nominal initial gain and delay estimates, which depend on the input signal dynamic ranges. As with the systems that utilize factory-programmed loop delay and gain values, calibrations of gain and delay parameters have to be performed across different operational power levels in order to meet system stability. In addition, neither of the above-described types of traditional systems is adapted to dynamically adjust the loop delay and gain, which may be a desirable feature of a closed-loop transmit power control system. Accordingly, what are needed are methods and apparatus for automatically determining and dynamically adjusting loop delay and gain in a closed-loop transmit power control system, while decreasing manufacturing time and cost and meeting control loop stability and performance specifications.

DETAILED DESCRIPTION

Figure 1:
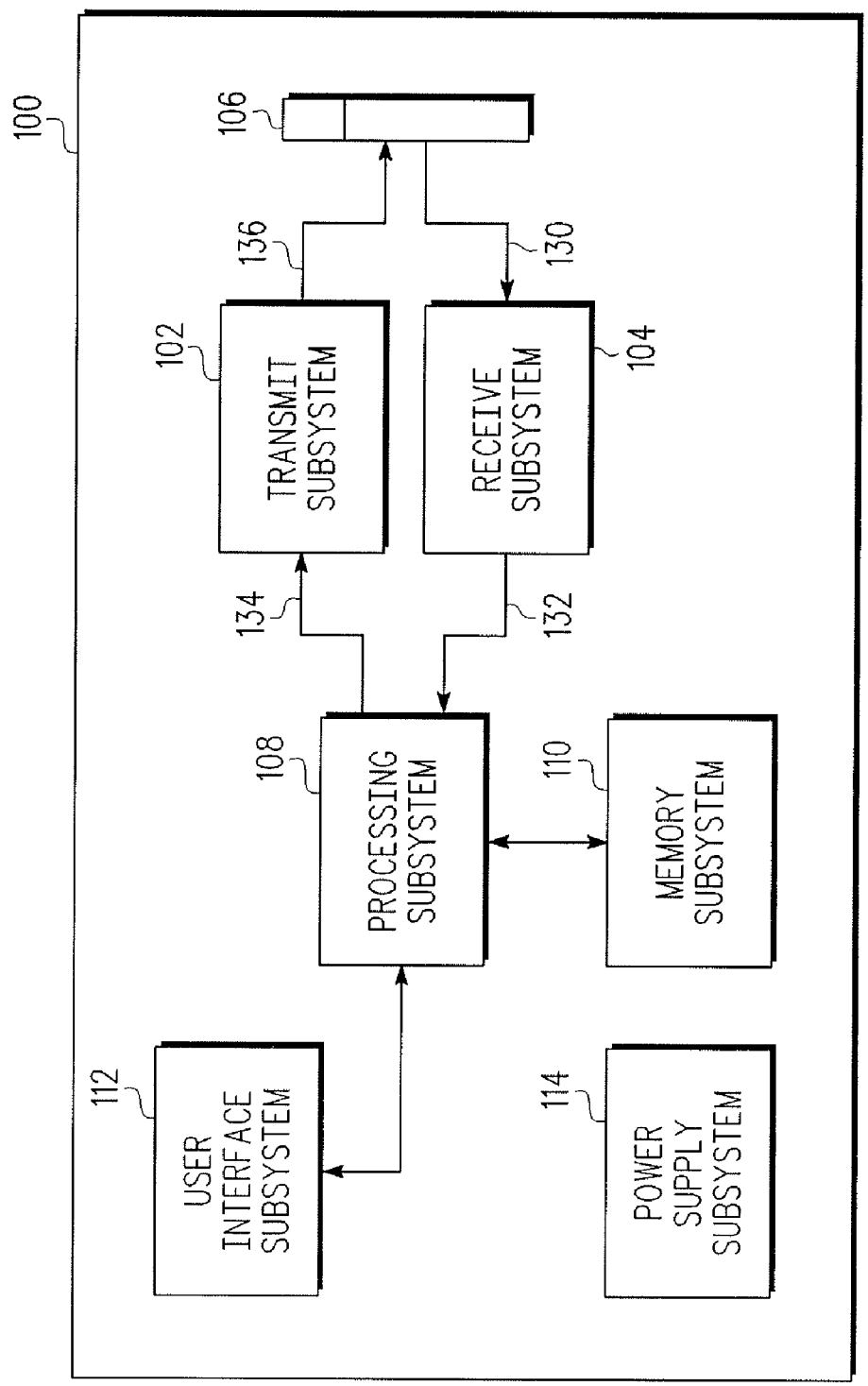
FIG. 1 illustrates a simplified block diagram of a wireless device, according to an example embodiment.

Embodiments described herein include automatic gain control methods and apparatus applied to transmitted radio frequency (RF) signals. Embodiments may provide one or more advantages over traditional transmitter apparatus and methods. As discussed previously, traditional closed-loop systems use factory-programmed loop control parameters to preserve closed-loop system stability and enhance performance. Alternatively, systems in which traditional predictor approaches are used attempt to preserve closed-loop system stability by estimating loop gain and loop delay, although such approaches use nominal initial gain and delay estimates that depend on the input signal dynamic ranges. Accordingly, factory calibration of the gain and delay parameters also is performed across different power levels of operation during the manufacture of such systems. In contrast, embodiments of the inventive subject matter may, in some embodiments, eliminate or at least reduce the need for extensive factory calibration of loop control parameters, thus reducing manufacturing time and cost. More particularly, some embodiments include methods and apparatus for estimating closed-loop system delay and gain (e.g., loop delay and loop gain) by employing cross-correlation between prior signal envelope information and the corresponding delayed and scaled version of the detected signal over an observation window. In other words, in some embodiments, prior signal envelope information is correlated with delayed signal information to dynamically calculate the loop gain and delay on a block-by-block basis. The determined loop delay and gain may be used in a process of dynamically correcting for the loop bandwidth in order to preserve loop stability.

Embodiments may be implemented, for example, in wireless systems, networks, and devices adapted to implement 2G (second generation), 2.5G (2.5 generation), 3G (third generation), 4G (fourth generation), and/or other wireless telephone technologies. For example, but not by way of limitation, embodiments may be implemented in wireless systems, networks, and devices that operate in accordance with one or more of various standards within a group that includes the family of 3$^{rd}$ Generation Partnership Project (3GPP) standards (e.g., Global System for Mobile Communications (GSM) standards and/or Universal Mobile Telecommunications System (UMTS) standards). Examples of GSM standards include, but are not limited to, General Radio Packet Service (GPRS), Enhanced Data Rates for Global System for Mobile Communications (GSM) Evolution (EDGE), Circuit Switched Data (CSD), and High Speed CSD (HSCSD)). Examples of UMTS standards include, but are not limited to, High Speed Packet Access (HSPA), UMTS Time Division Duplexing (UMTS-TDD) (e.g., TD-CDMA and TD-SCDMA), Freedom of Mobile Multimedia Access (FOMA), UMTS Rev. 8 (e.g., 3GPP Long Term Evolution (LTE) and High Speed Orthogonal frequency division multiplexing Packet Access HSOPA)). Alternate embodiments may be implemented in wireless systems, networks, and devices that operate in accordance with one or more other standards within a group that includes the family of 3$^{rd}$ Generation Partnership Project 2 (3GPP2) standards (e.g., code division multiple access One (cdmaOne), CDMA2000, Evolution-Data Optimized (EV-DO), and Ultra Mobile Broadband (UMB)). Still other alternate embodiments may be implemented in wireless systems, networks, and devices that operate in accordance with one or more other standards within a group that includes the family of Advanced Mobile Phone System (AMPS) standards (e.g., AMPS or digital AMPS (D-AMPS)). Still other alternate embodiments may be implemented in wireless systems, networks, and devices that operate in accordance with one or more other standards within a group that includes Institute of Electrical and Electronics Engineers (IEEE) 802 standards (e.g., 802.16 (e.g., Worldwide Interoperability for Microwave Access (WiMAX)), IEEE 802.20, and IEEE 802.22) and/or standards based on other wireless technologies. Although a particular type of wireless system, network, and/or device may be described herein for example purposes, the example system is not to be interpreted as limiting the scope of the various embodiments or the claims only to the below-described system or device. For example, embodiments below may be described in conjunction with a wideband CDMA (W-CDMA) system, network, device, and/or protocol, and the examples are not meant to limit application of the embodiments only to W-CDMA systems, networks, devices, and/or protocols.

FIG. 1 illustrates a simplified block diagram of a wireless device 100, in accordance with an example embodiment. Device 100 is adapted to transmit electromagnetic signals over an air interface. In a particular embodiment, wireless device 100 is adapted to transmit W-CDMA signals over the air interface according to a W-CDMA standard, although wireless device 100 may be adapted to transmit different types of wireless signals over the air interface according to different standards, in other embodiments. Wireless device 100 may form substantially all of or a portion of a variety of different types of apparatus. For example, but not by way of limitation, wireless device 100 may form substantially all of or a portion of a cellular telephone, a radio, a personal data assistant (PDA), a computer (e.g., a laptop, notebook, desktop or other type of computer), and/or another device that is adapted to transmit electromagnetic signals over an air interface.

Wireless device 100 includes at least one transmit subsystem 102, receive subsystem 104, antenna 106, processing subsystem 108, memory subsystem 110, user interface subsystem 112, and power supply subsystem 114, in an embodiment. These subsystems are communicatively coupled together as illustrated in FIG. 1, where the term "communicatively coupled" means that information signals are transmissible through various interconnections between the subsystems. The interconnections between the subsystems may be direct interconnections that include conductive transmission media, or may be indirect interconnections that include one or more intermediate electrical components. Although certain interconnections are illustrated in FIG. 1, it is to be understood that more, fewer or different interconnections may be present in other embodiments.

The at least one processing subsystem 108 is adapted to perform various functions. These functions may include, for example, generating outgoing digital signals 134, processing incoming digital signals 132, interfacing with the at least one memory subsystem 110 to store and retrieve data, interfacing with the at least one user interface subsystem 112, and performing various power control functions in conjunction with the at least one power supply system 114. An outgoing digital signal 134 may be generated as sequence of digital input samples, in an embodiment. The at least one power supply system 114 may include, for example, an interface to line power and/or a battery power subsystem.

User interface subsystem 112 may include one or more user interface components adapted to enable a user to input commands or other information into device 100 and/or to provide visual, auditory, or mechanical indicia intended to convey information to the user. For example, but not by way of limitation, user interface subsystem 110 may include one or more display screens, touch screens, lights, speakers, vibration devices, keypads, buttons, dials, and/or other components adapted to receive input commands and/or to produce information-conveying indicia.

Memory subsystem 110 may include one or more components adapted to store digital information in a retrievable format. For example, but not by way of limitation, memory subsystem 110 may include one or more removable or non-removable, volatile or non-volatile memory components, such as ROM-based memory components, RAM-based memory components, CDs, DVDs, and/or magnetic storage media (e.g., hard disks or floppy disks), to name a few.

Receive subsystem 104 is adapted to receive incoming RF signals 130 from antenna 106, and to perform down-conversion, filtering, and analog-to-digital conversion, among other things, to the incoming RF signals 130 in order to generate incoming digital signals 132. The incoming digital signals 132 may be processed by processing subsystem 108. In an alternate embodiment, for a transmit-only type of device, receive subsystem 104 may be excluded.

Transmit subsystem 102 (also referred to herein as a "transmitter," "RF transmitter," or "closed-loop transmitter") is adapted to receive outgoing digital signals 134 generated by processing subsystem 108, and to perform digital-to-analog conversion, up-conversion, automatic gain adjustment, and amplification, among other things, to the outgoing digital signals 134 in order to generate outgoing RF signals 136. The outgoing RF signals 136 are transmitted over the air interface by antenna 106. According to various embodiments, transmit subsystem 102 is adapted to apply a variable gain to outgoing digital signals 134 based on a sequence of gain control commands and/or a variable gain control signal. The resulting gain-adjusted signal is amplified by an output amplifier and provided to the device's antenna 106.

Figure 2:
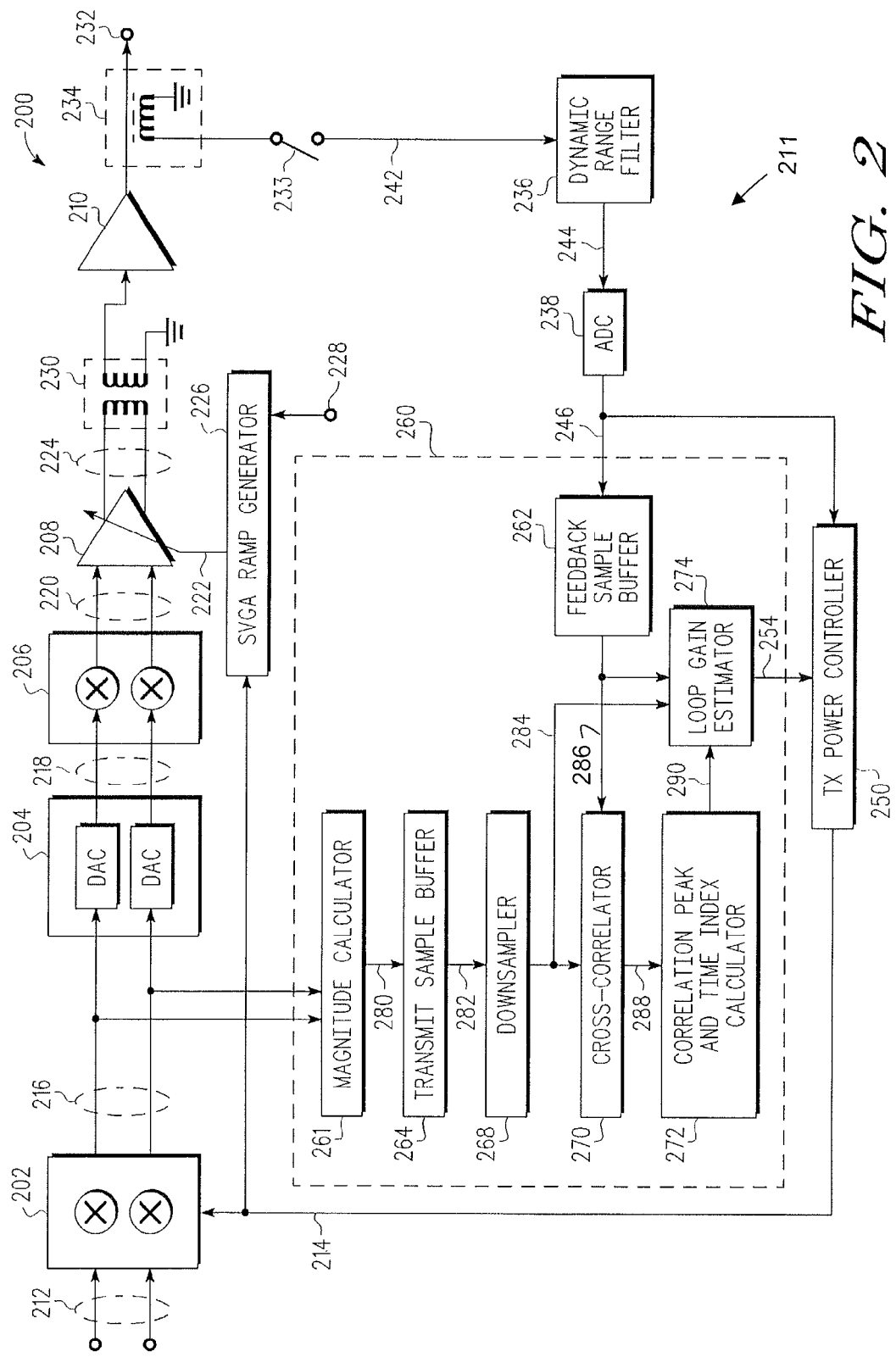
FIG. 2 illustrates a simplified block diagram of a portion of a radio frequency (RF) transmitter, according to an example embodiment.

FIG. 2 illustrates a simplified block diagram of a portion of a transmitter 200, in accordance with an example embodiment. Transmitter 200 may correspond, for example, to transmit subsystem 102, FIG. 1. As will be explained in more detail below, transmitter 200 is adapted dynamically to adjust the gain of an RF antenna output signal 232 (e.g., outgoing RF signal 136, FIG. 1), based on power control related commands received from other portions of the system (e.g., from processing subsystem 108, FIG. 1). Upon receipt of such a command, one or more processing and/or firmware portions of transmitter 200 converts the power control related command into gain control related signals (e.g., gain control input signal 228, among other things) for various gain control elements within transmitter 200 (e.g., SVGA ramp generator 226). The gain control elements receive the gain control related signals, and adaptively adjust the output signal gain according to the gain control related signals.

Transmitter 200 includes a gain application element 202, a digital-to-analog converter (DAC) block 204, an RF modulator 206, a stepped variable gain amplifier (SVGA) 208, a power amplifier 210, a gain adjustment feedback path 211, and a loop delay and gain calculator 260, in an embodiment. Gain application element 202 receives a sequence of digital input samples 212 (e.g., outgoing digital signal 134, FIG. 1). In an embodiment, the sequence of digital input samples 212 includes a sequence of multiple input data samples, which may include, for example, a sequence of discrete time samples of a signal to be transmitted (e.g., a transmission burst). In an embodiment, the sequence of digital input samples 212 includes a sequence of complex values represented in Cartesian coordinates, so that each value has a real part (I) and an imaginary part (Q), which are received in parallel. Accordingly, digital input samples 212 may include a sequence of values that may be represented as $X(k)=[I(k), Q(k)]$, where k indicates a sample number and $k=1 \ldots K$, $I(k)$ represents a real part of an input data sample, and $Q(k)$ represents an imaginary part of an input data sample. In alternate embodiments, digital input samples 212 may include sequences of values represented in polar coordinates or some other representation. Digital input samples 212 could represent, for example, baseband, time-domain representations of a sequence of signal bursts produced using W-CDMA technology. In alternate embodiments, digital input samples 212 could be produced using any of a number of other technologies, as discussed previously.

Along with the digital input samples 212, gain application element 202 also receives a digital gain signal 214, which is produced by feedback path 211. At times when a gain adjustment process is being performed, gain application element 202 is adapted to apply digital gains represented by the digital gain signal 214 to the digital input samples 212. Gain application element 202 applies the digital gains represented by digital gain signal 214 to the digital input samples 212 in order to generate a sequence of gain-compensated digital samples 216, which may be represented as $X_c(k)=[(G_i(k) \times I(k)), (G_q(k) \times Q(k))]$, for example, where $G_i(k)$ includes a sequence of gain values applied to the real part of the digital input samples 212, and $G_q(k)$ includes a sequence of gain values applied to the imaginary part of the digital input samples 212. Digital gain signal 214 includes a sequence of digital values that, when applied to digital input samples 212, should have the effect of pre-compensating for gains that will be applied by SVGA 208 to a corresponding analog portion of an RF signal 220. Essentially, digital gain signal 214 includes a sequence of digital values that are inversely related to the gains that will be applied by SVGA 208 to the RF signal 220. In addition, digital gain signal 214 is determined to compensate for distortion added to the RF antenna output signal 232 by at least the power amplifier 210 (and possibly other transmitter elements). Generation of digital gain signal 214 will be described in more detail later.

The gain-compensated digital samples 216 that are generated by gain application element 202 are received by DAC block 204. DAC block 204 performs an analog-to-digital conversion of the gain-compensated digital samples 216 in order to generate a gain-compensated analog signal 218. The gain-compensated analog signal 218 may be filtered by a baseband filter (not illustrated) in order to attenuate out-of-band components, in an embodiment. RF modulator 206 receives the gain-compensated analog signal 218, and up-converts the gain-compensated analog signal 218 to an appropriate RF carrier frequency in order to generate an RF signal 220, which is also referred to herein as a "pre-adjusted analog signal".

SVGA 208 is adapted to receive the RF signal 220 and a gain ramp signal 222, and to apply a sequence of gains represented by the gain ramp signal 222 to the RF signal 220 in order to generate a gain-adjusted RF signal 224, which is also referred to herein as a "gain-adjusted analog signal". In an alternate embodiment, a variable gain amplifier (VGA) may be used instead of SVGA 208 to generate the gain-adjusted RF signal 224.

Gain ramp signal 222 is generated by SVGA ramp generator 226 based on a gain control input signal 228 from the TX power controller 250. In addition, SVGA ramp generator 226 may receive digital gain signal 214, which specifies the SVGA gains to be applied while generating the SVGA ramp signal 222. Gain control input signal 228 indicates the time of occurrence of the gain changes that are to be applied to the RF signal 220 by SVGA 208. More specifically, gain control input signal 228 indicates the time instants at which the gains are to be applied to the RF signal 220. In the case of W-CDMA, adjustments to the system-determined gains may occur for each consecutive slot (e.g., every 0.67 milliseconds (ms)), although in practice, gain adjustments likely would occur less frequently (e.g., each 5 or 10 slots). In an embodiment, gain control input signal 228 also indicates a power change and a direction of change. The values for the system-determined gain may be based on various factors, such as a comparison between the then-current, received SIR and a target SIR, for example. In an embodiment, the gain ramp signal 222 includes a sequence of codes (e.g., 6-bit codes), each of which corresponds to a gain level that may be applied by SVGA 208 to RF signal 220. An SVGA gain transition, either upward or downward, is implemented by changing the code provided within gain ramp signal 222.

After SVGA 208 applies the gain to the RF signal 220 in accordance with the gain ramp signal 222, the resulting gain-adjusted RF signal 224 is de-coupled through transformer 230 and received by power amplifier 210. Essentially, the de-coupled, gain-adjusted RF signal 224 may be considered to be an analog version of the gain-compensated digital samples 216. Power amplifier 210 amplifies the de-coupled, gain-adjusted RF signal 224 to generate an RF antenna output signal 232. The RF antenna output signal 232 is transmitted over the air interface by an antenna (e.g., antenna 106, FIG. 1).

As mentioned above, at times when a gain adjustment process is being performed, gain application element 202 may apply digital gains represented by digital gain signal 214 to the digital input samples 212. The feedback loop 211 is "closed" (or "activated") when the gain adjustment process is being performed, and is "open" (or "de-activated") at other times. For description purposes, a switch 233 is illustrated in feedback loop 211 to indicate that feedback loop 211 may be open or closed (e.g., de-activated or activated) at various times. In practice, such a switch 233 may not actually be present. When feedback loop 211 is closed, gain application element 202 is adapted to combine the digital input samples 212 with the digital gain signal 214, with the intended result being that the combination will pre-distort the digital input samples 212 in a manner that mitigates non-linear distortion that may be produced by one or more non-linear devices in the transmit lineup (e.g., SVGA 208 and/or power amplifier 210). Although a particular embodiment of a feedback loop is illustrated in FIG. 2 and described herein, it is to be understood that any of a number of other types of feedback loops may be incorporated into transmitter 200, in other embodiments.

Feedback loop 211 is adapted to generate the digital gain signal 214. In an embodiment, feedback loop 211 includes a power detector 234, a dynamic range filter 236, an analog-to-digital converter (ADC) 238, and a transmit (TX) power controller 250. Power detector 234 detects the power level of the RF antenna output signal 232, and converts that power level into an analog feedback signal 242. Dynamic range filter 236 receives the analog feedback signal 242 and adjusts the dynamic range of the analog feedback signal 242 to generate a dynamic range-adjusted, analog feedback signal 244. In an embodiment, dynamic range filter 236 adjusts the analog feedback signal 242 to use substantially all of the dynamic range of the antenna output.

ADC 238 receives the dynamic range-adjusted, analog feedback signal 244, and performs a sampling and quantizing process to generate a sequence of digital feedback samples 246. ADC 238 performs the sampling process at a feedback signal data rate, $F_s$. For example, but not by way of limitation, the feedback signal data rate may have a value that is a fraction of the data rate of the digital input samples 212 (e.g., the "input signal data rate"). The feedback signal data rate may equal, for example but not by way of limitation, about ½, ⅕ or 1/10 of the input signal data rate, although the feedback signal data rate may equal the input signal data rate or may be some other fraction of the input signal data rate, in other embodiments. For example, if the input signal data rate equals approximately 62.4 megaHertz (MHz), the feedback signal data rate may equal about 31.2 MHz, 12.48 MHz or 6.24 MHz, although other input signal data rates and/or other feedback signal data rates may be employed in the system, in other embodiments. In still other embodiments, feedback path 211 may also include a downsampler (not illustrated), which may downsample the sequence of digital feedback samples 246 produced by ADC 238 in order to produce a sequence of digital feedback samples at the feedback signal data rate.

The digital feedback samples 246 are provided to transmit power controller 250 and loop delay and gain calculator 260. Transmit power controller 250 receives the digital feedback samples 246 and a loop gain estimate 254 produced by the loop delay and gain calculator 260, and calculates the digital gain signal 214, as will be described in more detail later.

Loop delay and gain calculator 260 is adapted to calculate the loop gain estimate 254 based on the sequence of digital feedback samples 246 and the sequence of gain-compensated digital samples 216. Loop delay and gain calculator 260 includes a magnitude calculator 261, a feedback sample buffer 262, a transmit sample buffer 264, a downsampler 268, a cross-correlator 270, a correlation peak and time index calculator 272, and a loop gain estimator 274, in an embodiment.

Magnitude calculator 261 is adapted to receive the sequence of gain-compensated digital samples 216, and to generate a corresponding sequence of input sample magnitudes 280 as $M(k)=\sqrt{(G_i(k)\times I(k))^2+(G_q(k)\times Q(k))^2}$. Transmit sample buffer 264 is adapted to receive and store the input sample magnitudes 280 as they are produced by magnitude calculator 261. Similarly, feedback sample buffer 262 is adapted to receive and store the digital feedback samples 246 as they are produced by ADC 238. In an embodiment, both feedback sample buffer 262 and transmit sample buffer 264 include a circular buffer having a buffer size that is capable of storing a plurality of blocks of input sample magnitudes 280 or digital feedback samples 246, respectively. Feedback sample buffer 262 and transmit sample buffer 264 may or may not be the same size.

Downsampler 268 is adapted to receive and downsample the buffered input sample magnitudes 282 in order to produce a sequence of downsampled, input sample magnitudes 284. In an embodiment, the ratio at which downsampler 268 performs the downsampling corresponds to the feedback signal data rate at which ADC 238 sampled the dynamic range-adjusted, analog feedback signal 244. In other words, the data rates of the sequence of downsampled, input sample magnitudes 284 and the sequence of digital feedback samples 246 are approximately equal. In an embodiment, downsampler 268 includes a multiple-order Cascaded Integrator-Comb (CIC) filter, such as a $4^{th}$ order CIC, for example.

Figure 4:
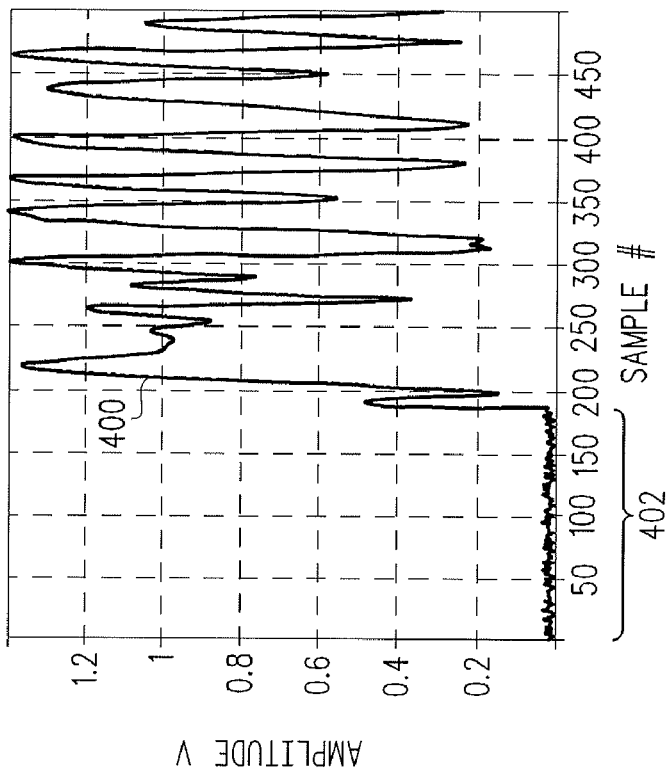
FIG. 4 is an example of a plot of a feedback signal envelope.
Figure 3:
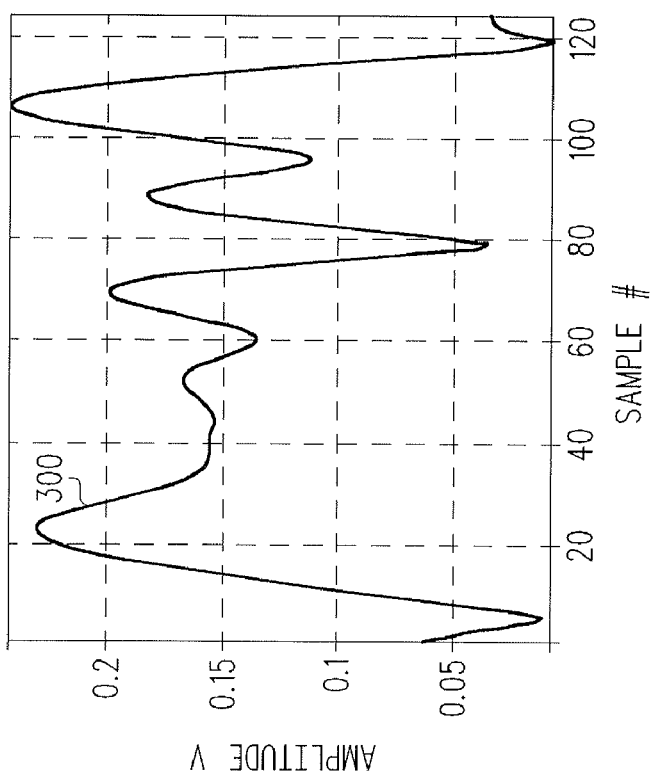
FIG. 3 is an example of a plot of an input signal envelope.

Cross-correlator 270 receives a set of the buffered feedback samples 286 and a set of the downsampled, input sample magnitudes 284, where each set corresponds to samples that fall within an observation window. In an embodiment, each set has a size that corresponds to the size of a baseband signal block. The set of downsampled, input sample magnitudes 284 reflect the envelope of the gain-compensated digital samples 216 (e.g., the baseband signal), and the set of buffered feedback samples 286 reflects the envelope of the digital feedback samples 246. Because of the loop delay inherently added by DAC 204, RF modulator 206, SVGA 208, amplifier 210, dynamic range filter 236, and ADC 238, the feedback signal envelope represented by the set of buffered feedback samples 286 may appear delayed, with respect to the input signal envelope (or baseband signal envelope) represented by the set of downsampled, input sample magnitudes 284. FIG. 3 is an example of a plot of an input signal envelope 300, and FIG. 4 is an example of a plot of a feedback signal envelope 400. A comparison between input signal envelope 300 and feedback signal envelope 400 indicates the presence of a delay 402 represented as a plurality of samples. This delay 402 indicates the loop delay inherent in the closed-loop transmitter 200.

Figure 5:
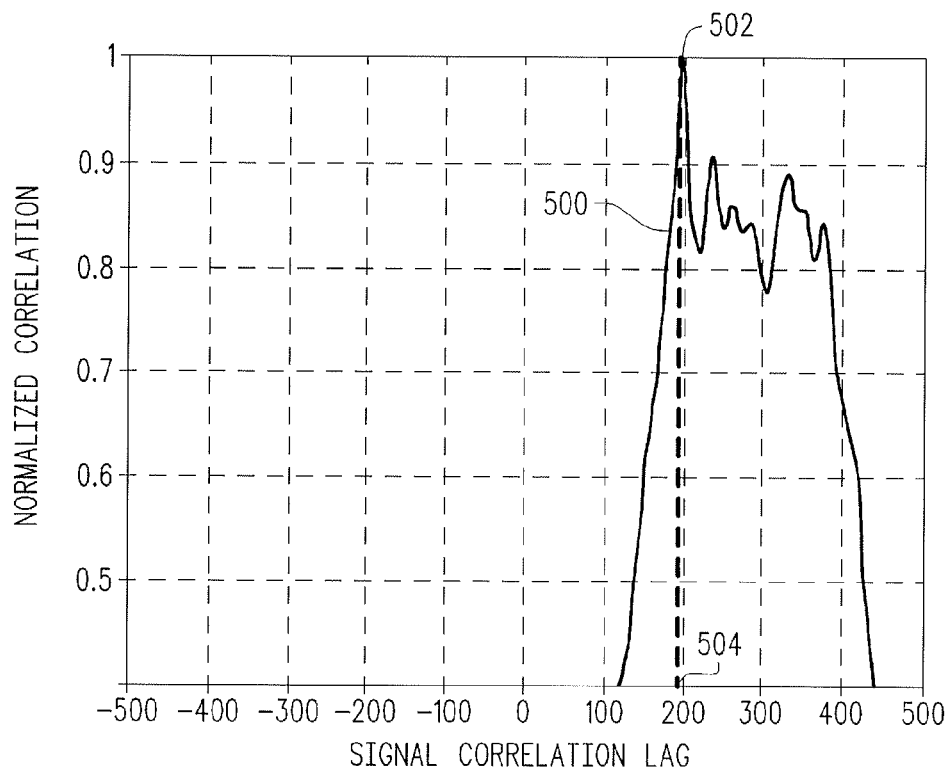
FIG. 5 is an example of a plot of normalized, cross-correlation values calculated by cross-correlating the input signal envelope of FIG. 3 and the feedback signal envelope of FIG. 4 over a range of signal correlation lags, according to an example embodiment.

Referring back to FIG. 2, cross-correlator 270 performs a plurality of cross-correlations between set of the buffered feedback samples 286 and a set of the downsampled, input sample magnitudes 284. Each cross-correlation uses one of a plurality of candidate signal correlation lags. In an embodiment, each candidate signal correlation lag represents a potential loop delay (e.g., measured in samples) between the gain-compensated digital samples 216 and the digital feedback samples 246. The cross-correlation process for each candidate signal correlation lag yields a cross-correlation value, and the plurality of cross-correlation values 288 are provided to correlation peak and time index calculator 272. In an embodiment, the cross-correlation values 288 are normalized, although they may not be normalized, in another embodiment. Cross-correlator 270 also may provide, with each of the plurality of cross-correlation values 288, an indication of the candidate signal correlation lag with which the cross-correlation value was determined. FIG. 5 is an example of a plot 500 of normalized, cross-correlation values calculated by cross-correlating the input signal envelope 300 of FIG. 3 with the feedback signal envelope 400 of FIG. 4 over a range of signal correlation lags, according to an example embodiment.

Referring also to FIG. 2, correlation peak and time index calculator 272 receives the plurality of cross-correlation values 288, and determines a correlation peak from the plurality of cross-correlation values 288. In an embodiment, the correlation peak may be determined as the cross-correlation value 288 having a largest value (e.g., the "maximum cross-correlation value"). For example, referring to the example reflected in FIG. 5, a maximum cross-correlation value 502 is clearly evident at a signal correlation lag 504 of about 190 samples. This indicates that the input signal envelope 300 of FIG. 3 and the feedback signal envelope 400 of FIG. 4 are most closely correlated with each other during the cross-correlation performed by cross-correlator 270 using a candidate signal correlation lag of about 190 samples.

In another embodiment, multiple potential correlation peaks may be determined, where the multiple correlation peaks may include a primary peak corresponding to the maximum cross-correlation value, and one or more secondary peaks corresponding to any other correlation values 288 that are within some pre-determined range of the primary peak. In such an embodiment, when multiple correlation peaks are identified, additional factors may be taken into account in order to determine the final correlation peak. For example, previously-determined correlation lags and/or other factors indicating a probability that one of the multiple correlation peaks is more likely to correspond to the actual correlation lag may be taken into account in determining the correlation peak. Upon determining a correlation peak, correlation peak and time index calculator 272 identifies an estimated time index 290 from the signal correlation lag associated with the correlation peak. The estimated time index 290 may represent the signal correlation lag in terms of a number of samples and/or a time delay, and the estimated time index 290 corresponds to an estimate of the loop delay.

Loop gain estimator 274 receives the estimated time index 290, the set of buffered feedback samples 286, and the set of downsampled, input sample magnitudes 284. Loop gain estimator 274 then shifts either the set of the buffered feedback samples 286 or the set of downsampled, input sample magnitudes 284 by the estimated time index 290, in order to time-align feedback signal envelope and the input signal envelope. Loop gain estimator 274 then calculates a loop gain estimate 254, which represents a difference, gain, and/or error between the time-aligned feedback signal envelope and the input signal envelope. In an embodiment, loop gain estimator 274 calculates the loop gain estimate 254 as a ratio between a peak of the time aligned feedback signal envelope and the input signal envelope. More particularly, loop gain estimator 274 calculates the loop gain estimate 254 as a ratio between one or more sets of corresponding samples of the feedback signal envelope and the input signal envelope, in an embodiment. The loop gain estimate 254 may be determined, in an embodiment, by converting the time-aligned feedback signal envelope and the input signal envelope to a decibel (dB) domain and performing a dB domain subtraction to obtain instantaneous gain estimates. The subtraction may be performed in hardware using a subtractor, in an embodiment.

Loop delay and gain calculator 260, or more particularly loop gain estimator 274, provides the loop gain estimate 254 to transmit power controller 250. Based on the loop gain estimate 254 and the digital feedback signal 246 received from ADC 238, transmit power controller 250 generates the digital gain signal 214 to perform the closed loop ramp up and down of the transmit power level. In an embodiment, TX power controller 250 receives the digital feedback signal 246 and compares it with an internal reference ramp signal, and the error signal between them is accumulated to produce digital gain signal 214. Because the digital gain signal 214 includes a component that reflects the loop gain, the combination of the digital gain signal 214 with the digital input samples 212 should produce a digital feedback signal 246 having an envelope that accurately reflects the gain-compensated envelope of the gain-compensated digital samples 216 (e.g., a "gain-compensated input signal envelope").

Figure 6:
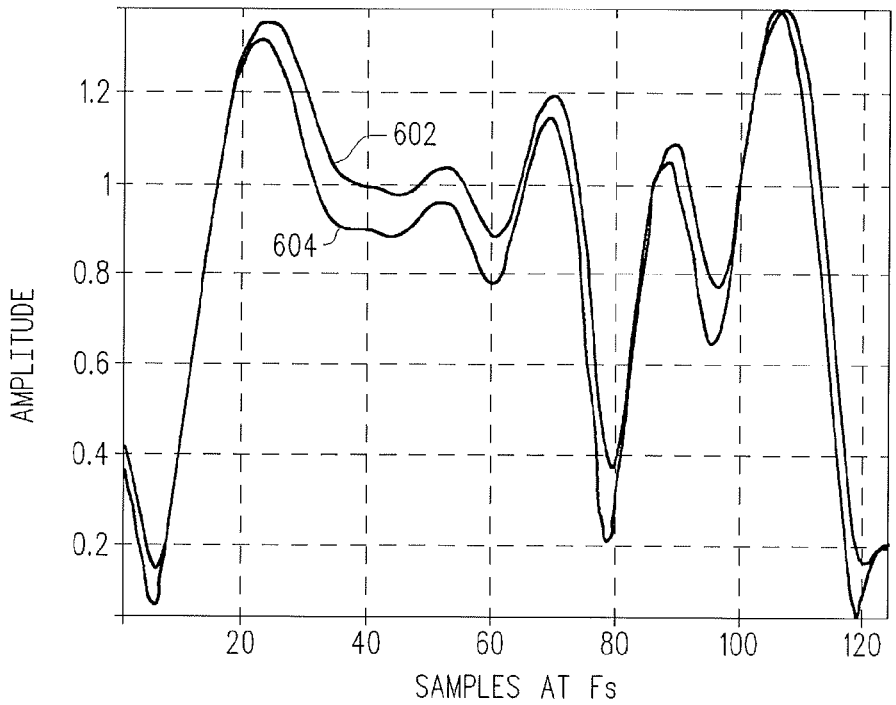
FIG. 6 is an example of a plot of a gain compensated input signal envelope compared with a plot of a time-aligned feedback signal envelope, according to an example embodiment.

FIG. 6 is an example of a plot of a gain-compensated input signal envelope 602 compared with a plot of a time-aligned feedback signal envelope 604, according to an example embodiment. A comparison of the gain-compensated input signal envelope 602 and the time-aligned feedback signal envelope 604 indicates that a digital gain signal (e.g., digital gain signal 214) generated according to an example embodiment, may enable gain-compensated input signal envelope 602 to accurately reflect gains determined from the time-aligned feedback signal envelope 604.

Figure 7:
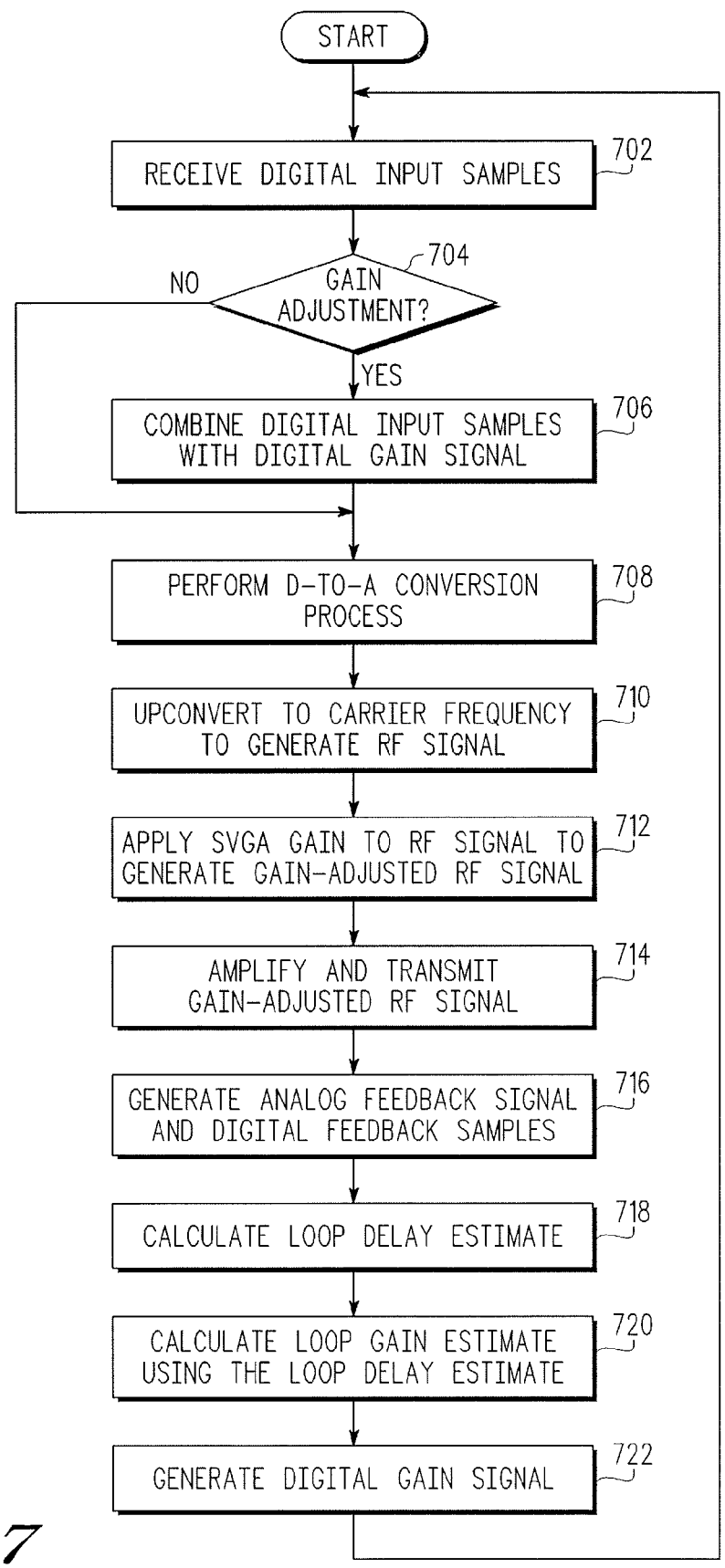
FIG. 7 illustrates a flowchart of a method for automatically performing gain control using a dynamically generated estimate of the loop delay and gain, according to an example embodiment.

FIG. 7 illustrates a flowchart of a method for automatically performing gain control using a dynamically generated estimate of the loop delay and gain, according to an example embodiment. Referring also to FIG. 2, the method may begin, in block 702, when a sequence of digital input samples (e.g., digital input samples 212) is received. A determination may then be made, in block 704, whether gain adjustment currently is being performed. When gain adjustment is being performed, then a digital gain signal is combined (e.g., by gain application element 202), in block 706, with the digital input samples to generate a sequence of gain-compensated digital samples (e.g., gain-compensated digital samples 216). Generation of the digital gain signal will be discussed in subsequent steps, and an assumption is made at this point that such steps have been performed based on previously received digital input samples. When gain adjustment is not being performed, then block 706 may be bypassed and the digital input samples 212 may be passed on for transmission. In block 708, a digital-to-analog (D-to-A) conversion process is performed (e.g., by DAC block 204) to convert the gain-compensated digital samples into the analog domain. The resulting gain-compensated analog signal (e.g., gain-compensated analog signal 218) is then upconverted (e.g., by RF modulator 206) to a carrier frequency, in block 710, in order to generate an RF signal (e.g., RF signal 220).

In block 712, a gain ramp signal (e.g., gain ramp signal 222) is generated, and SVGA gains are applied to the RF signal (e.g., by SVGA 208) based on the gain ramp signal in order to generate a gain-adjusted RF signal (e.g., gain-adjusted RF signal 224). In block 714, the gain-adjusted RF signal (e.g., gain-adjusted RF signal 224, which may also be referred to herein as the analog version of the gain-compensated digital samples 216) generated by the SVGA is amplified (e.g., by power amplifier 210) and transmitted over the air interface. In block 716, an analog feedback signal (e.g., analog feedback signal 242) is generated from the antenna output signal, and a sequence of digital feedback samples (e.g., digital feedback samples 246) is produced from the analog feedback signal.

A loop delay estimate (e.g., time index 290) is calculated, in block 718, from the gain-compensated digital samples and the sequence of digital feedback samples. In an embodiment, calculating the loop delay estimate includes the steps (not illustrated) of: 1) generating a sequence of input sample magnitudes from the sequence of gain-compensated digital samples; 2) buffering the digital feedback samples; 3) buffering the input sample magnitudes; 4) downsampling the input sample magnitudes in order to produce a sequence of downsampled, input sample magnitudes; 5) cross-correlating a set of the digital feedback samples with a set of the downsampled, input sample magnitudes to generate a plurality of cross-correlation values; and 6) determining a correlation peak from the plurality of cross-correlation values, wherein the correlation peak corresponds to the loop delay estimate.

In block 720, the loop gain estimate is calculated using the loop delay estimate, the gain-compensated digital samples, and the sequence of digital feedback samples. In an embodiment, calculating the loop gain estimate includes the steps (not illustrated) of: 1) time-aligning a feedback signal envelope reflected by the set of the digital feedback samples with an input signal envelope reflected by set of input sample magnitudes; and 2) calculating the loop gain estimate from the time-aligned feedback signal envelope and input signal envelope.

In block 722, the digital gain signal is generated from the sequence of digital feedback samples and the loop gain estimate. In an embodiment, this includes comparing the digital feedback samples with an internal reference ramp signal and accumulating the error signal between them to generate the digital gain signal. The method may then iterate, as shown in FIG. 7, for subsequently received digital input samples.

It is to be understood that certain ones of the process blocks depicted in FIG. 7 may be performed in parallel with each other or with performing other processes. For example, in a closed-loop transmitter, an RF signal generated based on previously-received digital input samples may be being fed back and analyzed to determine loop delay and gain in parallel with receiving new digital input samples. In addition, it is to be understood that the particular ordering of the process blocks depicted in FIG. 7 may be modified, while achieving substantially the same result. Accordingly, such modifications are intended to be included within the scope of the inventive subject matter.

Although embodiments discussed above describe the use of a power amplifier, those skilled in the art will recognize that the various embodiments may be employed in other types of analog gain control stages. For example, other types of analog gain control stages in which an embodiment may be implemented include, but are not limited to, baseband amplifiers or RF amplifiers that include a VGA, an SVGA, a voltage controlled amplifier or a power amplifier.

Thus, various embodiments of wireless devices, transmitters, and methods for controlling loop delay and gain in closed-loop transmitters and wireless devices have been described. A particular embodiment includes a transmitter of a wireless device. The transmitter includes a gain application element, a power amplifier, a feedback path, and a loop delay and gain calculator. The gain application element is adapted to receive a sequence of digital input samples and a digital gain signal, and to combine the digital gain signal with the digital input samples to generate a sequence of gain-compensated digital samples. The power amplifier is adapted to receive and amplify an analog version of the gain-compensated digital samples in order to generate an antenna output signal. The feedback path is adapted to generate an analog feedback signal from the antenna output signal, to produce a sequence of digital feedback samples from the analog feedback signal, and to generate the digital gain signal from the sequence of digital feedback samples and a loop gain estimate. The loop delay and gain calculator is adapted to calculate a loop delay estimate from the gain-compensated digital samples and the sequence of digital feedback samples, and to calculate the loop gain estimate using the loop delay estimate, the gain-compensated digital samples, and the sequence of digital feedback samples.

Another embodiment includes a wireless device that includes a processing subsystem adapted to generate an outgoing digital signal as a sequence of digital input samples, a closed-loop transmitter, and an antenna adapted to receive an antenna output signal from the closed-loop transmitter and to transmit the antenna output signal over an air interface. The closed-loop transmitter includes a gain application element, a power amplifier, a feedback path, and a loop delay and gain calculator. The gain application element is adapted to receive the sequence of digital input samples and a digital gain signal, and to combine the digital gain signal with the digital input samples to generate a sequence of gain-compensated digital samples. The power amplifier is adapted to receive and amplify an analog version of the gain-compensated digital samples in order to generate an antenna output signal. The feedback path is adapted to generate an analog feedback signal from the antenna output signal, to produce a sequence of digital feedback samples from the analog feedback signal, and to generate the digital gain signal from the sequence of digital feedback samples and a loop gain estimate. The loop delay and gain calculator adapted to calculate a loop delay estimate by cross-correlating versions of the gain-compensated digital samples and the digital feedback samples, and to calculate the loop gain estimate using the loop delay estimate, the gain-compensated digital samples, and the sequence of digital feedback samples.

Another embodiment includes a method for performing loop delay and gain control in a wireless device. The method includes the steps of receiving a sequence of digital input samples and a digital gain signal, combining the digital gain signal with the digital input samples to generate a sequence of gain-compensated digital samples, and amplifying an analog version of the gain-compensated digital samples in order to generate an antenna output signal. The method also includes the steps of generating an analog feedback signal from the antenna output signal, to produce a sequence of digital feedback samples from the analog feedback signal, generating the digital gain signal from the sequence of digital feedback samples and a loop gain estimate, and calculating a loop delay estimate from the gain-compensated digital samples and the sequence of digital feedback samples, and calculating the loop gain estimate using the loop delay estimate, the gain-compensated digital samples, and the sequence of digital feedback samples.

Embodiments described above have discussed signal processing based on values represented in Cartesian coordinates. Accordingly, digital signal processing carried out by the system may be performed using techniques appropriate for Cartesian coordinate calculations. In other embodiments, some values may be represented in polar coordinates or using other representations. It is to be understood that the scope of the inventive subject matter is intended to include embodiments in which digital signal processing carried out by the system may be performed using techniques appropriate for polar coordinate calculations or other types of calculations. Embodiments of the inventive subject matter may include other modifications, as well.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A transmitter of a wireless device, the transmitter comprising:
a gain application element adapted to receive a sequence of digital input samples and a digital gain signal, and to combine the digital gain signal with the digital input samples to generate a sequence of gain-compensated digital samples;
a power amplifier adapted to receive and amplify an analog version of the gain-compensated digital samples in order to generate an antenna output signal;
a feedback path adapted to generate an analog feedback signal from the antenna output signal, to produce a sequence of digital feedback samples from the analog feedback signal, and to generate the digital gain signal from the sequence of digital feedback samples and a loop gain estimate; and
a loop delay and gain calculator adapted to calculate a loop delay estimate from the gain-compensated digital samples and the sequence of digital feedback samples, and to calculate the loop gain estimate using the loop delay estimate, the gain-compensated digital samples, and the sequence of digital feedback samples, wherein the loop delay estimate represents a loop delay between the gain-compensated digital samples and the digital feedback samples.

2. A transmitter of a wireless device, the transmitter comprising:
a gain application element adapted to receive a sequence of digital input samples and a digital gain signal, and to combine the digital gain signal with the digital input samples to generate a sequence of gain-compensated digital samples;
a power amplifier adapted to receive and amplify an analog version of the gain-compensated digital samples in order to generate an antenna output signal;
a feedback path adapted to generate an analog feedback signal from the antenna output signal, to produce a sequence of digital feedback samples from the analog feedback signal, and to generate the digital gain signal from the sequence of digital feedback samples and a loop gain estimate; and
a loop delay and gain calculator adapted to calculate a loop delay estimate from the gain-compensated digital samples and the sequence of digital feedback samples, and to calculate the loop gain estimate using the loop delay estimate, the gain-compensated digital samples, and the sequence of digital feedback samples, wherein the loop delay and gain calculator comprises:
a magnitude calculator adapted to generate a sequence of input sample magnitudes from the sequence of gain-compensated digital samples;
a cross-correlator adapted to correlate a set of the digital feedback samples with a set of the input sample magnitudes to generate a plurality of cross-correlation values; and
a correlation peak calculator adapted to determine a correlation peak from the plurality of cross-correlation values, wherein the correlation peak corresponds to the loop delay estimate.

3. The transmitter of claim 2, further comprising a loop gain estimator adapted to time-align a feedback signal envelope reflected by the set of the digital feedback samples with an input signal envelope reflected by set of input sample magnitudes, and to calculate the loop gain estimate from the time-aligned feedback signal envelope and input signal envelope.

4. The transmitter of claim 3, wherein the loop gain estimator calculates the loop gain estimate from the time-aligned feedback signal envelope and input signal envelope by converting the time-aligned feedback signal envelope and the input signal envelope to a decibel (dB) domain and performing a dB domain subtraction to obtain instantaneous gain estimates.

5. The transmitter of claim 2, wherein the loop delay and gain calculator further comprises:
a transmit sample buffer adapted to buffer the input sample magnitudes; and
a feedback sample buffer adapted to buffer the digital feedback samples.

6. The transmitter of claim 2, wherein the loop delay and gain calculator further comprises:
a downsampler adapted to receive and downsample the input sample magnitudes in order to produce a sequence of downsampled, input sample magnitudes that are used by the cross-correlator as the set of input sample magnitudes.

7. The transmitter of claim 1, wherein the feedback path comprises a transmit power controller adapted to generate the digital gain signal from the sequence of digital feedback samples and the loop gain estimate by comparing the digital feedback samples with an internal reference ramp signal and accumulating the error signal between them to generate the digital gain signal.

8. The transmitter of claim 1, further comprising:
a digital-to-analog converter adapted to receive the gain-compensated digital samples and to convert the gain-compensated digital samples into a gain-compensated analog signal;
a radio frequency (RF) modulator adapted to receive the gain-compensated analog signal and to modulate the gain-compensated analog signal to an RF carrier frequency to generate a pre-adjusted analog signal; and
a stepped variable gain amplifier (SVGA) adapted to apply gains indicated in a gain ramp signal to the pre-adjusted analog signal in order to generate the analog version of the gain-compensated digital samples.

9. The transmitter of claim 1, wherein the gain application element is adapted to receive the digital input samples as a sequence of signal bursts produced using wideband code division multiple access.

10. The transmitter of claim 1, further comprising:
an antenna adapted to receive the antenna output signal and to transmit the antenna output signal over an air interface.

11. A wireless device comprising:
a processing subsystem adapted to generate an outgoing digital signal as a sequence of digital input samples;
a closed-loop transmitter that includes;
a gain application element adapted to receive the sequence of digital input samples and a digital gain signal, and to combine the digital gain signal with the digital input samples to generate a sequence of gain-compensated digital samples,
a power amplifier adapted to receive and amplify an analog version of the gain-compensated digital samples in order to generate an antenna output signal,
a feedback path adapted to generate an analog feedback signal from the antenna output signal, to produce a sequence of digital feedback samples from the analog feedback signal, and to generate the digital gain signal from the sequence of digital feedback samples and a loop gain estimate, and a loop delay and gain calculator adapted to calculate a loop delay estimate by cross-correlating versions of the gain-compensated digital samples and the digital feedback samples, and to calculate the loop gain estimate using the loop delay estimate, the gain-compensated digital samples, and the sequence of digital feedback samples; and an antenna adapted to receive the antenna output signal and to transmit the antenna output signal over an air interface.

12. The wireless device of claim 11, wherein the outgoing digital signal is generated as a sequence of signal bursts produced using wideband code division multiple access technology.

13. The wireless device of claim 11, wherein the wireless device forms at least a portion of a device selected from a group of devices that includes a cellular telephone, a radio, a personal data assistant, and a computer.

14. A method for performing loop delay and gain control in a wireless device transmitter, the method comprising the steps of:

receiving a sequence of digital input samples and a digital gain signal;

combining the digital gain signal with the digital input samples to generate a sequence of gain-compensated digital samples;

amplifying an analog version of the gain-compensated digital samples in order to generate an antenna output signal;

generating an analog feedback signal from the antenna output signal, to produce a sequence of digital feedback samples from the analog feedback signal;

generating the digital gain signal from the sequence of digital feedback samples and a loop gain estimate;

calculating a loop delay estimate from the gain-compensated digital samples and the sequence of digital feedback samples, wherein the loop delay estimate represents a loop delay between the gain-compensated digital samples and the digital feedback samples; and calculating the loop gain estimate using the loop delay estimate, the gain-compensated digital samples, and the sequence of digital feedback samples.

15. A method for performing loop delay and gain control in a wireless device transmitter, the method comprising the steps of:

receiving a sequence of digital input samples and a digital gain signal;

combining the digital gain signal with the digital input samples to generate a sequence of gain-compensated digital samples;

amplifying an analog version of the gain-compensated digital samples in order to generate an antenna output signal;

generating an analog feedback signal from the antenna output signal, to produce a sequence of digital feedback samples from the analog feedback signal;

generating the digital gain signal from the sequence of digital feedback samples and a loop gain estimate;

calculating a loop delay estimate from the gain-compensated digital samples and the sequence of digital feedback samples by generating a sequence of input sample magnitudes from the sequence of gain-compensated digital samples, cross-correlating a set of the digital feedback samples with a set of the input sample magnitudes to generate a plurality of cross-correlation values, and determining a correlation peak from the plurality of cross-correlation values, wherein the correlation peak corresponds to the loop delay estimate; and calculating the loop gain estimate using the loop delay estimate, the gain-compensated digital samples, and the sequence of digital feedback samples.

16. The method of claim 15, further comprising the step of:

time-aligning a feedback signal envelope reflected by the set of the digital feedback samples with an input signal envelope reflected by set of input sample magnitudes, and wherein calculating the loop gain estimate comprises calculating the loop gain estimate from the time-aligned feedback signal envelope and input signal envelope.

17. The method of claim 16, wherein calculating the loop gain estimate comprises calculating the loop gain estimate from the time-aligned feedback signal envelope and input signal envelope by converting the time-aligned feedback signal envelope and the input signal envelope to a decibel (dB) domain and performing a dB domain subtraction to obtain instantaneous gain estimates.

18. The method of claim 15, further comprising the steps of:

buffering the input sample magnitudes; and buffering the digital feedback samples.

19. The method of claim 15, further comprising the step of:

downsampling the input sample magnitudes in order to produce a sequence of downsampled, input sample magnitudes that are used in the cross-correlating step as the set of input sample magnitudes.

20. The method of claim 14, further comprising the step of generating the digital gain signal from the sequence of digital feedback samples and the loop gain estimate by comparing the digital feedback samples with an internal reference ramp signal and accumulating the error signal between them to generate the digital gain signal.

* * * * *